United States Patent
Yang

(10) Patent No.: US 7,473,616 B2
(45) Date of Patent: Jan. 6, 2009

(54) METHOD AND SYSTEM FOR WAFER BONDING OF STRUCTURED SUBSTRATES FOR ELECTRO-MECHANICAL DEVICES

(75) Inventor: Xiao Yang, Cupertino, CA (US)

(73) Assignee: Miradia, Inc., Sunnyvale, CA (US)

( * ) Notice: Subject to any disclaimer, the term of this patent is extended or adjusted under 35 U.S.C. 154(b) by 0 days.

(21) Appl. No.: 11/022,383

(22) Filed: Dec. 23, 2004

(65) Prior Publication Data

US 2006/0141745 A1    Jun. 29, 2006

(51) Int. Cl.
*H01L 21/30* (2006.01)

(52) U.S. Cl. .................. 438/455; 257/618; 257/621; 257/E21.088; 257/E21.567

(58) Field of Classification Search .......... 438/455, 438/456, 458, 457, 406; 257/618, 619, 620, 257/621, E21.088, E21.567
See application file for complete search history.

(56) References Cited

U.S. PATENT DOCUMENTS

| | | | | |
|---|---|---|---|---|
| 6,180,496 | B1 * | 1/2001 | Farrens et al. | 438/455 |
| 6,822,326 | B2 * | 11/2004 | Enquist et al. | 257/729 |
| 7,078,317 | B2 * | 7/2006 | Henley | 438/455 |
| 2004/0081809 | A1 * | 4/2004 | Gomez et al. | 428/209 |
| 2005/0006738 | A1 * | 1/2005 | Schaper et al. | 257/678 |
| 2005/0260828 | A1 * | 11/2005 | Yuasa | 438/455 |
| 2005/0285172 | A1 * | 12/2005 | Freeman et al. | 257/296 |
| 2006/0048885 | A1 * | 3/2006 | Constantin et al. | 156/230 |

FOREIGN PATENT DOCUMENTS

WO    WO01/29890 A2 *   4/2001

OTHER PUBLICATIONS

Eagle2000glass substrate datasheet 2 pages.*
Eagle2000TM history from Corning company.*
* cited by examiner

*Primary Examiner*—W. David Coleman
*Assistant Examiner*—Su C Kim
(74) *Attorney, Agent, or Firm*—Patterson & Sheridan, LLP

(57) ABSTRACT

A method for forming a composite substrate structure. The method includes providing a first substrate, the first substrate having a surface region and a backside region, providing a handling substrate, the handling substrate having a bonding surface and a handling surface, and activating at least one of the surface region of the first substrate and the bonding surface of the handling substrate using a surface activation process. The method also includes thereafter contacting the surface region of the first substrate to the bonding surface of the handling substrate to form a composite substrate structure, and thereafter applying a voltage to the backside region and the handling surface of the composite substrate structure. In one embodiment, the step of activating at least one of the surface region of the first substrate and the bonding surface of the handling substrate is performed in a plasma activation chamber.

20 Claims, 8 Drawing Sheets

METHOD AND SYSTEM FOR WAFER BONDING OF STRUCTURED SUBSTRATES FOR ELECTRO-MECHANICAL DEVICES

BACKGROUND OF THE INVENTION

The present invention relates generally to packaging techniques. More particularly, the invention includes a method and structure for forming composite substrate structures. Merely by way of example, the invention has been applied to the bonding of a patterned silicon substrate and a transparent substrate. The method and structure can be applied to other applications as well, such as packaging of optical sensors, electromechanical sensors, optoelectronic components, and the like.

Visual display technologies have developed rapidly over the years. Most particularly, electronic displays for the presentation of video signals have undergone rapid development in recent years and are experiencing increasing levels of customer adoption. A variety of video displays have utilized cathode ray tube (CRT), liquid crystal display (LCD), and spatial light modulator (SLM) technology. Both LCDs and SLMs are typically used in projection display units, in which light is first projected onto electrically activated pixel elements of the LCD or SLM and subsequently re-imaged at a display screen.

A particular SLM technology sold by Texas Instruments Incorporated (TI) of Dallas, Tex., is referred to as Digital Light Processing™ or DLP™. DLP relies upon a few hundred thousand tiny mirrors, which form an array of micromirrors. Each of the mirrors is hinged and an actuator is attached to each of the hinges. The actuator is often activated by electrostatic energy that can tilt each of the mirrors at high frequency. The moving mirrors can modulate light, which can be transmitted through a lens and then displayed on a screen. Although DLP has been successful, it is often difficult to manufacture and subject to low yields, etc. DLP is also manufactured using MEMS based processing techniques. Such MEMS based processing techniques are often costly and difficult to scale up for efficient processing. More specifically, packaging techniques used for MEMS are often costly and difficult to scale up to production levels.

From the above, it is seen that an improved technique for packaging devices is desired.

SUMMARY OF THE INVENTION

According to the present invention, a method and structure for forming composite substrate structures using wafer bonding techniques is provided. Merely by way of example, the invention has been applied to the bonding of a patterned silicon substrate and a transparent substrate. The method and structure can be applied to other applications as well, such as packaging of optical sensors, electromechanical sensors, optoelectronic components, and the like.

In a specific embodiment according to the present invention, a method for forming a composite substrate structure is provided. The method comprises providing a first substrate, the first substrate having a surface region and a backside region and providing a handling substrate, the handling substrate having a bonding surface and a handling surface. The method also comprises activating at least one of the surface region of the first substrate and the bonding surface of the handling substrate using a surface activation process and thereafter contacting the surface region of the first substrate to the bonding surface of the handling substrate to form a composite substrate structure. Further, the method comprises thereafter applying a voltage to the backside region and the handling surface of the composite substrate structure.

In another embodiment according to the present invention, a method for forming a composite substrate structure is provided. The method comprises providing a silicon substrate, the silicon substrate having a backside surface and a patterned surface comprising a plurality of border regions and providing a transparent substrate, the transparent substrate having bonding surface and a handling surface. The method also comprises providing a plasma activation chamber and activating at least one of the patterned surface of the silicon substrate and the bonding surface of the transparent substrate using a plasma activation process performed in the plasma activation chamber. The method further comprises thereafter contacting the patterned surface of the silicon substrate and the bonding surface of the transparent substrate to form a composite substrate structure and thereafter applying a voltage to the backside surface and the handling surface of the composite substrate structure.

Numerous benefits are achieved using the present invention over conventional techniques. For example, in an embodiment according to the present invention, the strength and durability of the bond formed between materials is increased. Additionally, structures wafer bonded according to embodiments of the present invention provide benefits typically available through high temperature annealing processes although performed at low temperatures. Depending upon the embodiment, one or more of these benefits may exist. These and other benefits have been described throughout the present specification and more particularly below.

Various additional objects, features and advantages of the present invention can be more fully appreciated with reference to the detailed description and accompanying drawings that follow.

DESCRIPTION OF SPECIFIC EMBODIMENTS

Embodiments according to the present invention provide a method and structure for forming composite substrate structures using wafer bonding techniques. Merely by way of example, the invention has been applied to the bonding of a patterned silicon substrate and a transparent substrate. The method and structure can be applied to other applications as well, such as packaging of optical sensors, electromechanical sensors, optoelectronic components, and the like.

Figure 1:
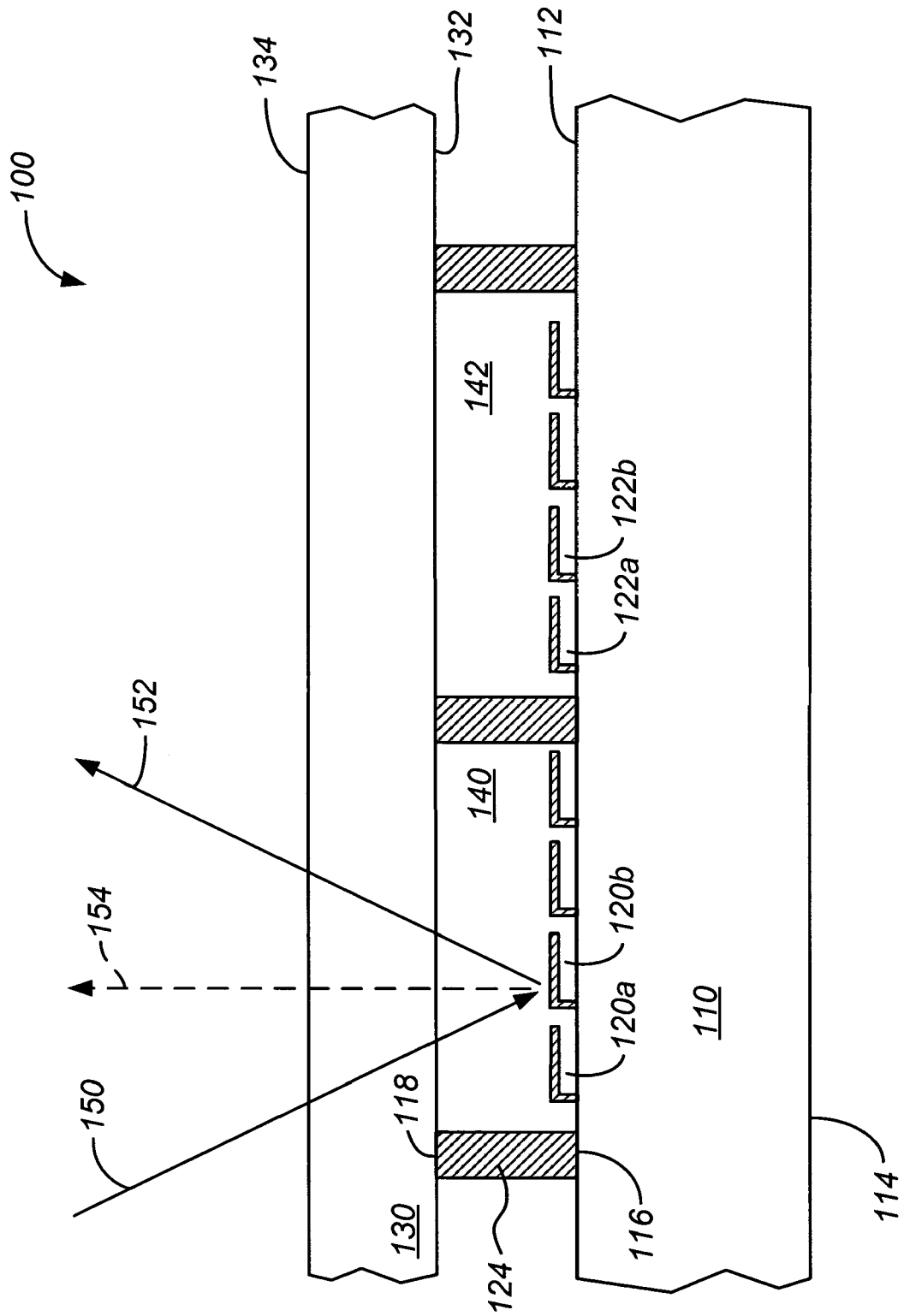
FIG. 1 is a simplified schematic illustration of a MEMS package.

FIG. 1 is a simplified schematic illustration of a MEMS package. MEMS package 100 includes device substrate 110 and handling substrate 130. In one embodiment of the present invention, the device substrate 110 is a silicon substrate. The device substrate has a first surface 112, referred to as a device surface, and a second surface 114, referred to as a support surface. As illustrated in FIG. 1, a number of micro-mirror devices 120, 122 are coupled to the device surface 112 of the silicon substrate. In a particular embodiment of the present invention, an array of micro-mirror devices are coupled to the device surface 112. Moreover, the device substrate provides for multiple arrays of micro-mirror devices on a single substrate. Referring to FIG. 1, two adjacent arrays of micro-mirror devices are illustrated, the first array including micro-mirror devices 120a, 120b, etc. located in chamber 140 and a second array including micro-mirror devices 122a, 122b, etc. located in chamber 142. Typically, the chambers are separated at a selected stage of packaging, with each chamber providing an SLM array used in a projection display system.

Optical illumination provide by an optical source (not shown) directs a beam of light 150 that passes through the handling substrate 130 and impinges on the micro-mirror array 120. Electrical activation of the micro-mirror array elements is controlled by electrical circuitry (not shown), resulting in reflection of the incident light in a selected direction. For example, if an individual micro-mirror is in an unactivated state, incident light is reflected toward a display screen (not shown) along path 152. If an individual micromirror is in an activated state, the light is reflected along path 154 toward a beam dump (not shown). Thus, the array of micro-mirrors can be operated to generate video signals displayed by the projection display system.

Referring once again to FIG. 1, standoff regions 124 separate the device substrate 110 from the handling substrate 130. These standoff regions 124 define the dimensions of chambers 140 and 142 surrounding the micro-mirror arrays 120 and 122. In a particular embodiment of the present invention, the standoff regions are fabricated from a silicon substrate. Additional details of the structure, geometry, and fabrication of the standoff regions 124 are disclosed in pending U.S. application Ser. No. 10/947,879, filed Sep. 22, 2004, commonly owned, and hereby incorporated by reference for all purposes.

Figure 2:
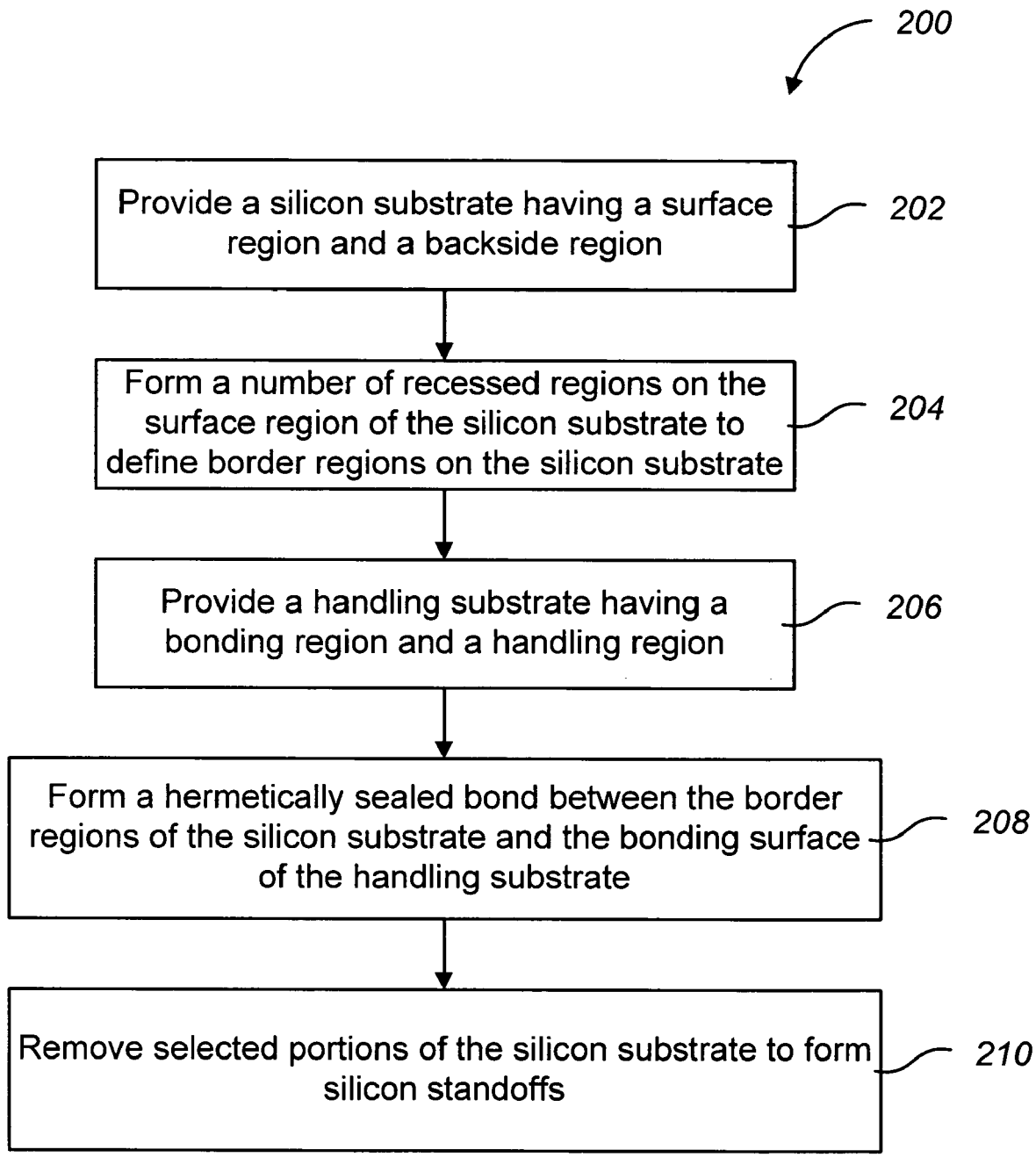
FIG. 2 is a simplified flowchart illustrating a method for wafer bonding two substrates to form a composite substrate structure according to one embodiment of the present invention.
Figure 3A:
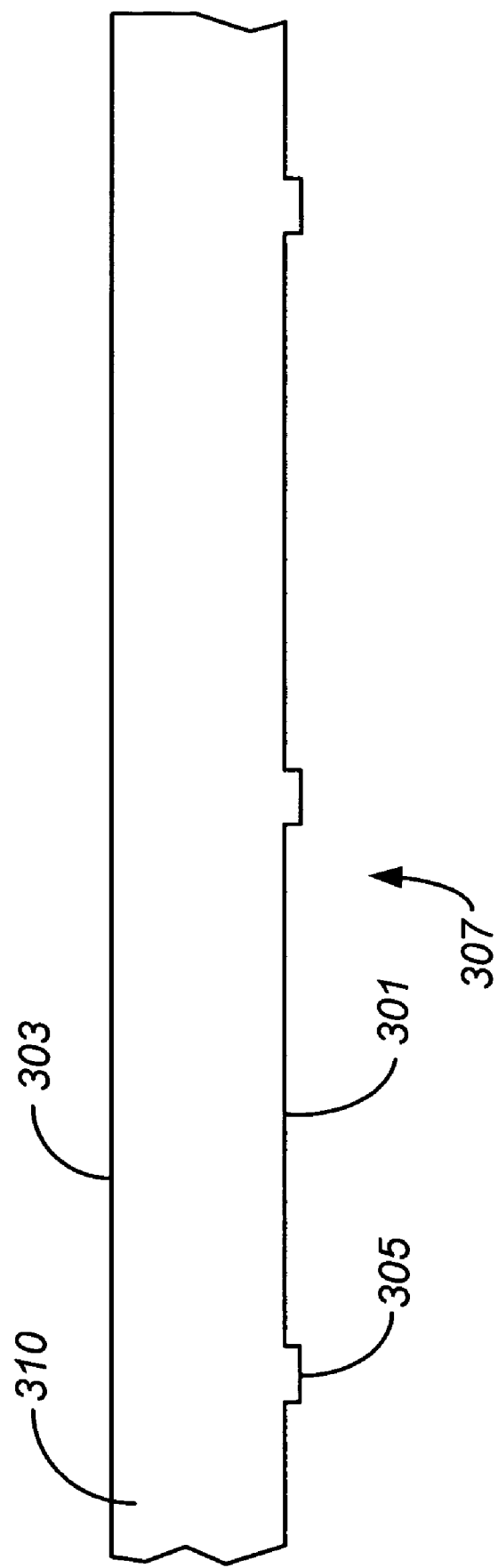
FIGS. 3A-3C are simplified cross-sectional view diagrams illustrating a method for wafer bonding two substrates to form a composite substrate structure according to one embodiment of the present invention.
Figure 3B:
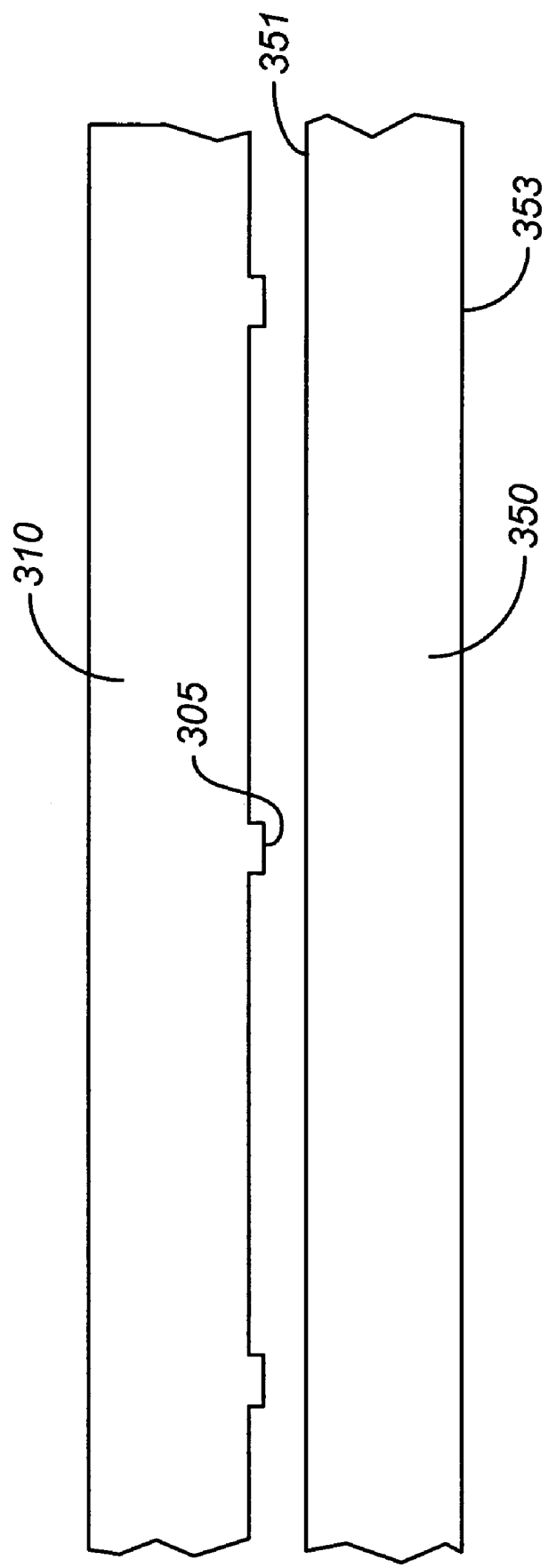
Figure 3C:
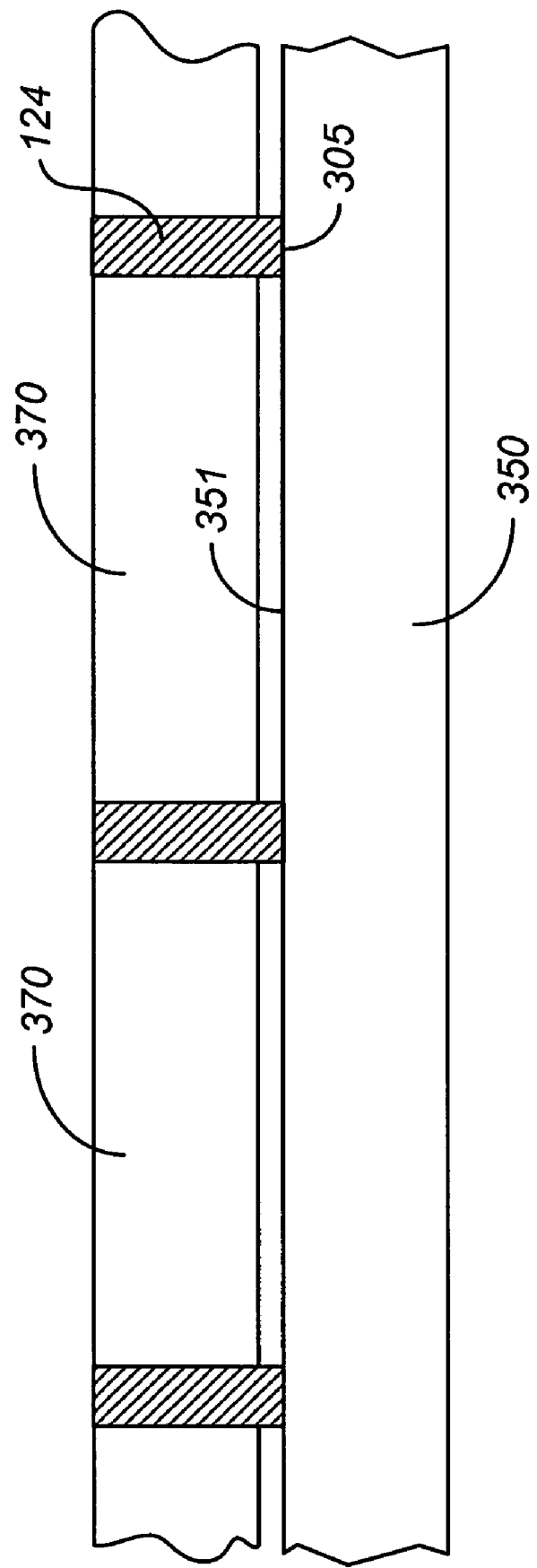

In one embodiment of the present invention, a process is used to fabricate the standoff regions from a silicon substrate as described below. FIG. 2 is a simplified flowchart illustrating a method for wafer bonding two substrates to form a composite substrate structure according to one embodiment of the present invention. FIGS. 3A-3C are simplified cross-sectional view diagrams illustrating a method for wafer bonding two substrates to form a composite substrate structure according to one embodiment of the present invention. These diagrams are merely examples, which should not unduly limit the scope of the claims herein. One of ordinary skill in the art would recognize many variations, alternatives, and modifications. As shown, the diagrams provide methods for wafer bonding two substrates.

As illustrated in FIGS. 2 and 3A, the method includes providing a silicon substrate 310 in step 202, e.g. a silicon wafer. The silicon substrate has a surface region 307 and a backside region 303. The surface region is often called a face region, although other terms may be used. The method also includes forming a plurality of recessed regions 301 on the surface region in step 204. Each of the plurality of recessed regions defines a border region 305. The plurality of recessed regions forms a patterned surface region. Depending upon the application, masking and etching techniques can be used to form each of the recessed regions. Preferably, each of the recessed regions has a depth of more than about 10 μm although other depths can be used. Plasma and/or reactive ion etching techniques may be used, depending upon the embodiment. Each of the recessed regions corresponds to a region to be occupied by at least one "chip" or "device" depending upon the embodiment.

In step 206, a handling substrate is provided including a bonding region and a handling region. Referring to the cross sectional view illustrated in FIG. 3B, the method includes bonding the patterned surface region of the silicon wafer 310 to a bonding region of a handling substrate 350. The handling substrate includes bonding region 351 and backside region 353. In one embodiment of the present invention, the handling substrate is a glass substrate. In a particular embodiment, the handling substrate is optically transparent, such as a Corning® EAGLE$^{2000}$™ display grade glass panel manufactured by Corning Incorporated of One Riverfront Plaza, Corning, N.Y. 14831, although other glass substrates may be used. Other products useful as handling substrates are manufactured by Hoya Corporation of Tokyo, Japan or Schott North America, Inc. of Elmsford, N.Y. 10523. Moreover, in some embodiments of the present invention, an anti-reflection (AR) coating is applied to one or both surfaces of the handling substrate. Quarter wave ($\lambda/4$) coatings of $MgF_2$ or other suitable dielectric materials can be used to form broad-band AR coatings. For example, a $\lambda/4$ $MgF_2$ coating centered at 550 nm (with an index of refraction of 1.38 at 550 nm) deposited on a Corning EAGLE$^{2000}$™ display grade glass substrate results in a power reflectance less than 2% per surface across the visible spectrum (400-700 nm). Of course, AR coatings made of other materials or stacks of thin films will be apparent to one of ordinary skill in the art. Additionally, one of ordinary skill in the art would recognize many variations, modifications, and alternatives.

In some embodiments of the present invention, it is desirable to form a hermetically sealed bond between the bonding surface 351 of the handling substrate and the border regions 305 of the silicon substrate. Thus, in step 208, illustrated in FIG. 3C, the silicon substrate and the handling substrate are brought into physical contact and bonded together at border regions 305. In step 210, illustrated in FIG. 3C and described more fully in pending U.S. application Ser. No. 10/947,879, filed Sep. 22, 2004, selected regions 370 of the silicon substrate are exposed to an etchant and removed while maintaining each of the border regions 124, sometimes referred to as silicon standoffs. Referring to FIG. 1, the silicon standoffs 124 are bonded to the device substrate 110 at regions 116 to form the structure as illustrated in FIG. 1.

One method of forming a hermetic bond is anodic bonding, which generally involves applying a large voltage potential across the interface between a silicon substrate and a glass substrate at elevated temperatures. Typically, the silicon and glass substrates are brought into contact and a positive lead is connected to the silicon substrate while a negative lead is connected to the glass substrate. The voltage potential is applied using these leads to generate an electric field at the silicon/glass interface. Although glass substrates are primarily composed of silicon and oxygen, sodium, along with other elements are generally present in the substrate material and resident at silicon lattice sites. Some glass substrates, for example Pyrex®, contain a high concentration of alkali metal oxides. At elevated temperatures (e.g. 200° C.-500° C.) the large voltage potential dissociates the alkali metal oxides and drives the metal ions into the glass. Consequently, the process creates an oxygen-rich layer (a $Na^+$ depletion layer) at the silicon-glass interface. The electric field present at the interface forces the oxygen ions to migrate into the silicon lattice, forming a bond at the interface.

In some anodic bonding applications, the electrostatic attraction between the substrates undergoing bonding provides sufficient mechanical contact during the bonding process. In these applications, additional mechanical force is not used to keep the substrates in physical contact as the electrostatic force provides sufficient pressure at the interface. Annealing after the application of the electric field will result in diffusion of the oxygen atoms into the silicon substrate along with diffusion of silicon to fill the $Na^+$ vacancies, forming a layer of amorphous $SiO_2$ at the interface.

In some display applications, low sodium content glass substrates are utilized. In these applications, the sodium content of the glass is limited in order to limit the contamination of transistors due to the migration of sodium ions during the lifetime of operation of the display. In particular, due to the close proximity between the glass substrate and the thin film transistors (TFT) present in many active-matrix-TFT displays, the migration of sodium ions from the glass substrate to the TFT may result in contamination and reductions in transistor lifetime and reliability. Although low sodium content glasses provide benefits related to reduced mobile ion migration, it is more difficult to perform anodic bonding using these low sodium content glass substrates. The low concentration of mobile sodium ions in the substrate results in a reduction in oxygen and silicon diffusion at the interface, typically weakening the bond formed during the anodic bonding/annealing process.

Another method of forming a hermetic bond is covalent bonding. In covalent bonding processes, a covalent bond is formed as electrons are shared between adjacent atoms. Generally, for a covalent bonding process to result in high yield, the local surface root-mean-square (RMS) roughness of the two surfaces should be less than 5 Å. Accordingly, covalent bonding has been used in silicon on insulator (SOI) processes, in which the silicon wafers used in the bonding process possess a high degree of surface flatness. For example, in one SOI process, a silicon wafer is covalently bonded to another silicon wafer having either a native oxide or a thermally grown silicon oxide surface. However, covalent bonding of glass substrates to silicon presents challenges. In general, glass substrates may possess local flatness on the order of less than 5 Å, but also possess larger scale waviness in excess of 5 Å. Additionally, scratches present on the glass surface can exceed 5 Å in depth, reducing the local surface flatness. These surface defects may result in voids at the covalently bonded interface, typically weakening the bond formed during the covalent bonding process.

In some covalent bonding processes, plasma activation of the bonding surfaces is performed prior to bringing the substrates into physical contact. For example, in an SOI process, the silicon/silicon oxide substrate surfaces are initially exposed to a plasma. The plasma is commonly an oxygen or an argon plasma, although other plasma sources may be used. The wafers are then brought into physical contact either in situ in the plasma chamber or after removal from the plasma chamber. The mechanism by which plasma activation increases the bond strength of the subsequently formed covalent bond is attributed to several different chemical/physical processes. These mechanisms include disordering of the surface of the substrate, injection of charge into the substrate surface, generation of hydrophilic species on the substrate surface, and intensification of chemical reactions at the bond interface. Of course, these mechanisms may apply to both substrate surfaces when both surfaces are exposed to a plasma activation process. However, knowledge of the actual chemical/physical mechanism is not necessary for the purposes of practicing embodiments of the present invention.

In some plasma activated covalent bonding processes, covalent bonds are formed at the bond interface at either room temperature or after a low temperature (less than 300° C.) anneal. Although the use of plasma activated covalent bonding processes has been used for bonding of silicon substrates, the use of the process to bond silicon substrates to glass substrates is still limited by the waviness of the glass substrate, along with local defects, such as scratches.

Figure 4:
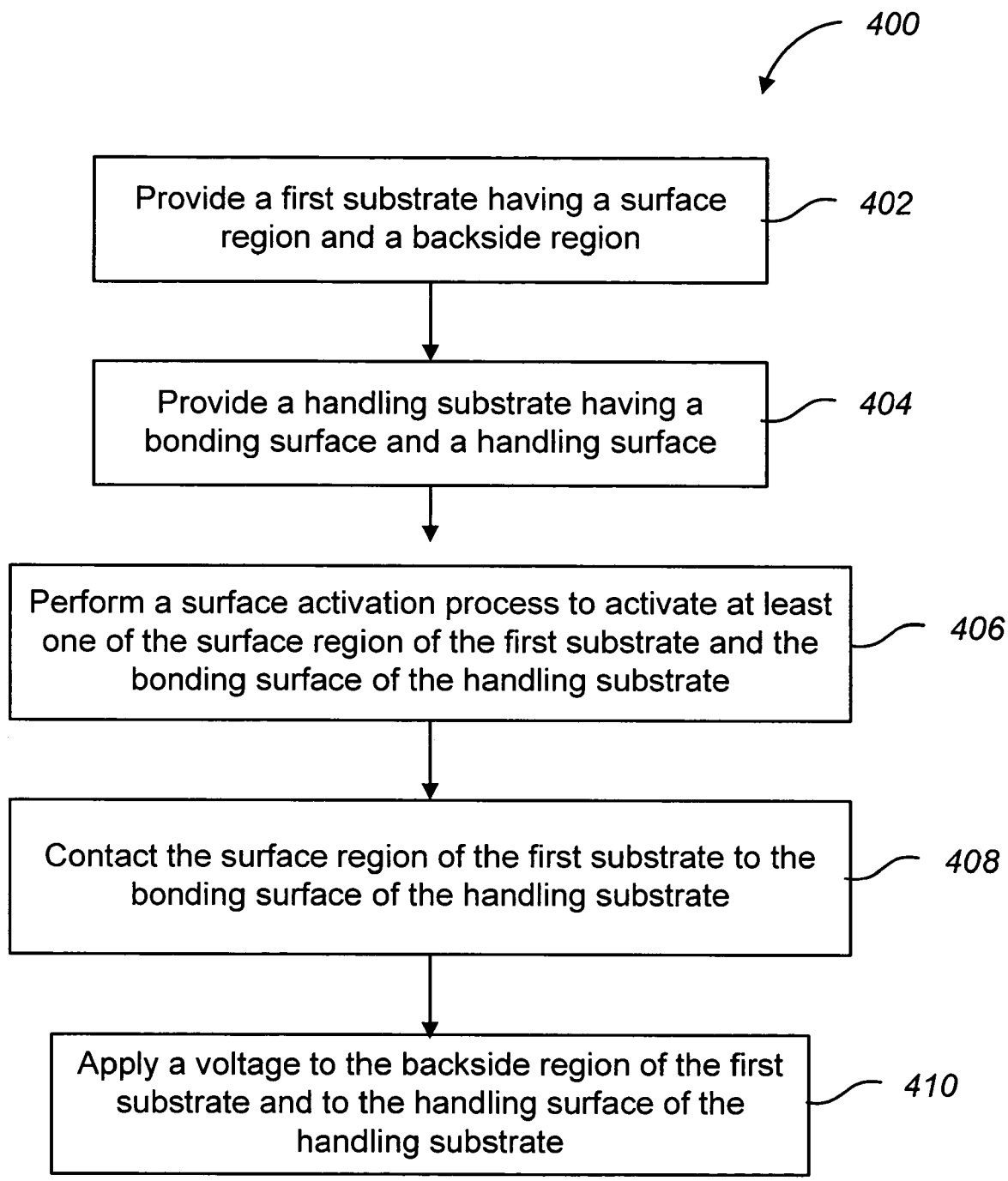
FIG. 4 is a simplified flowchart illustrating a bonding process according to one embodiment of the present invention.

FIG. 4 is a simplified flowchart illustrating a bonding process according to one embodiment of the present invention. In step 402 of the bonding process 400, a first substrate is provided having a surface region and a backside region. In a specific embodiment, the first substrate is a silicon substrate, but this is not required by the present invention. Alternative embodiments use other substrates such as silicon on insulator substrates. In step 404, a handling substrate is provided having a bonding surface and a handling surface. In a particular embodiment, the handling substrate is a display grade glass substrate such as a Corning® EAGLE2000™ glass panel. In some embodiments, the glass substrate is a low sodium content glass panel suitable for use in display applications, although this is not required by the present invention. In a particular embodiment, the display grade glass substrate is characterized by a sodium concentration of less than 1% by weight. Other transparent substrates are utilized in alternative embodiments.

A surface activation process is performed in step 406 to activate at least one of the surface region of the first substrate and the bonding surface of the handling substrate. In a particular embodiment of the present invention, both the surface region of the first substrate and the bonding surface of the handling substrate are activated in step 406. In alternative embodiments, a single substrate surface is activated in step 406. In some of these embodiments, the surface activation comprises a surface treatment that produces a hydrophilic surface, for example, a surface with available hydroxyl groups (e.g. OH dangling bonds). Other atomic structures providing a hydrophilic bonding surface are produced in alternative embodiments. One of ordinary skill in the art would recognize many variations, modifications, and alternatives.

In some embodiments according to the present invention, the surface activation process is a plasma activation process performed in a plasma activation chamber. In one embodiment, the plasma activation chamber is a wafer bonding system manufactured by EV Group of Schaerding, Austria. In a particular embodiment, a species selected from the group of oxygen, argon, nitrogen, ammonia, and hydrogen radicals is utilized as the reactive species in the plasma activation chamber. In alternative embodiments, a combination of excited radicals is used in the generation of the reactive plasma. The reactive species modify the chemical activity of the surface by creating different functional groups on the surface. For example, after plasma activation, the functional groups may form stronger chemical bonds and provide increased surface area for bond formation.

In alternative embodiments, the surface activation process is a wet process. In this wet process, the electron density present on either the surface region of the first substrate, the bonding surface of the handling substrate, or both, is increased above the level prior to the process.

In embodiments in which a plasma activation process is performed, pre-selected voltages and times are utilized during the process. In a particular embodiment, at least one of the first substrate and the handling substrate are coupled to the cathode during the plasma activation process. Of course, the particular operating parameters will depend on the specific applications. Moreover, at least one of the first substrate and the handling substrate are exposed to the plasma generated in the plasma activation chamber for a predetermined time period. For example, in one embodiment, the substrates are exposed to the activating plasma for a time in the range of 30 seconds to 5 minutes. In some embodiments, the substrates are exposed for the same time period, but this is not required by the present invention. In alternative embodiments, the substrates are exposed for different time periods. Merely by way of example, in a particular embodiment, the first substrate is exposed to the activating plasma for 30 seconds and the handling substrate is exposed to the activating plasma for 30 seconds. Selection of the exposure time is a function of chamber power, as will be evident to one of skill in the art.

In embodiments of the present invention, surface activation of the substrate surfaces provides additional mobile charge carriers at the surfaces. In a particular embodiment in which a silicon substrate is exposed to an activating plasma, additional mobile carriers are created at the silicon surface due to the plasma activation process. In another embodiment, the concentration of dangling bonds at the silicon surface is increased during the plasma activation process. Moreover, similar activation of mobile charge carriers and/or an increase in dangling bond concentration occurs at the surface of the handling substrate. Of course, detailed description of the physical mechanism active at the surfaces of the first substrate and the handling substrate is not necessary to practice the present invention.

In step 408, the surface region of the first substrate is brought into physical contact with the bonding surface of the handling substrate. In one embodiment in which a plasma activation chamber is utilized, contact between the two surfaces is made in situ, prior to removal of the two substrates from the plasma activation chamber. In alternative embodiments, contact between the two surfaces is made after the removal of the two substrates from the plasma activation chamber.

A voltage is applied to the backside region of the first substrate and to the handling surface of the handling substrate in step 410. The application of the voltage in step 410 is performed in some embodiments utilizing pre-selected voltages and times. For example, in one embodiment, a voltage in the range of 400-1200 V is applied to the two surfaces. Of course, the particular operating parameters will depend on the specific applications.

Some embodiments of the present invention utilize the surface activation of one or more of the surfaces to provide additional mobile charge carriers at the interface between the first substrate and the handling substrate. These additional mobile charge carriers are preferably initially present at the interfaces during the application of the voltage across the substrates. In a particular embodiment, the mobile charge carriers migrate under the influence of the electric field potential. In particular, charge migration in a glass substrate used as a handling substrate provides lattice vacancies to which silicon atoms relocate from a silicon substrate during the application of the external voltage.

Moreover, in embodiments of the present invention, the voltage applied to the composite substrate structure is maintained at a given voltage for a predetermined time period. For example, in one embodiment, the voltage is applied to the substrates for 5 minutes. In alternative embodiments, the temporal duration of the applied voltage is greater or less than 5 minutes. Additionally, in some embodiments, the voltage applied to the composite structure varies as a function of time.

Merely by way of example, in one particular embodiment, the voltage is ramped up as a function of time, starting at a voltage of 500 V and increasing to a voltage of 1000 V at a time of 5 minutes. In this particular example, the voltage is increased linearly as a function of time, but this is not required by the present invention. In other embodiments, the voltage increases exponentially as a function of time before saturating at the final value. Of course, the particular functional relationship describing the applied voltage will be selected based on the particular applications.

Figure 5:
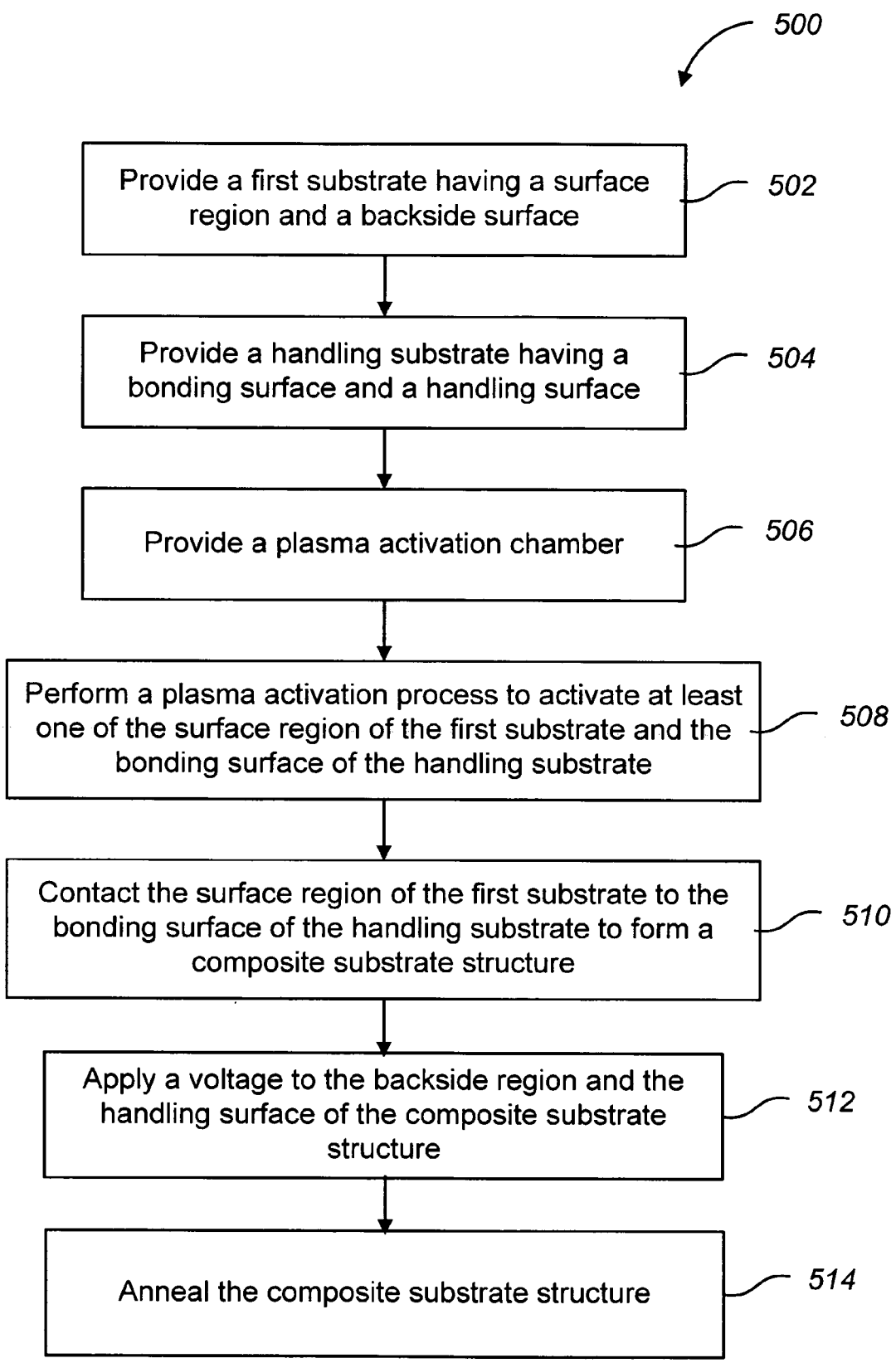
FIG. 5 is a simplified flowchart illustrating a bonding process according to an alternative embodiment of the present invention.

FIG. 5 is a simplified flowchart illustrating a bonding process according to an alternative embodiment of the present invention. In step 502 of the bonding process 500, a first substrate is provided having a surface region and a backside region. As described above, in a specific embodiment, the first substrate is a silicon substrate, but this is not required by the present invention. Alternative embodiments use other substrates. In step 504, a handling substrate is provided having a bonding surface and a handling surface. As described above, in a particular embodiment, the handling substrate is a display grade glass substrate such as a Corning® EAGLE$^{2000}$™ glass panel. Other transparent substrates are utilized in alternative embodiments.

A plasma activation chamber is provided in step 506. In one embodiment, the plasma activation chamber is a semi-automated or fully-automated wafer bonding system manufactured by EV Group of Schaerding, Austria. In a particular embodiment, a species selected from the group of oxygen, argon, nitrogen, ammonia, and hydrogen radicals is utilized as the reactive species in the plasma activation chamber. In alternative embodiments, a combination of excited radicals is used in the generation of the reactive plasma. A plasma activation process is performed in step 508 to activate at least one of the surface region of the first substrate and the bonding surface of the handling substrate. In a particular embodiment of the present invention, both the surface region of the first substrate and the bonding surface of the handling substrate are plasma activated in step 508. In alternative embodiments, a single substrate surface is plasma activated in step 508. In some of these embodiments, the surface activation comprises a surface treatment that produces a hydrophilic surface, for example, a surface with available OH bonds. Other atomic structures providing a hydrophilic bonding surface are produced in alternative embodiments. One of ordinary skill in the art would recognize many variations, modifications, and alternatives.

In step 510, the surface region of the first substrate is brought into physical contact with the bonding surface of the handling substrate to form a composite substrate structure. In one embodiment, contact between the two surfaces is made in situ, prior to removal of the two substrates from the plasma activation chamber. In alternative embodiments, contact between the two surfaces is made after the removal of the two substrates from the plasma activation chamber.

In step 512, a voltage is applied to the backside region and the handling surface of the composite substrate structure. As described above, the application of the voltage in step 512 is performed in some embodiments utilizing pre-selected voltages and times. Moreover, the use of contact enhancing materials and the functional relationship of the applied voltage as a function of time varies from one embodiment to the next.

The composite substrate structure is annealed in step 514. As illustrated in FIG. 5, the annealing process is performed subsequent to the application of the external voltage to the composite structure, but this is not required by the present invention. In alternative embodiments, the annealing process is performed simultaneously with step 512. In yet other embodiments, the annealing process is commenced coincident with or during step 512 and continues until after the termination of step 512. In additional alternative embodiments, the annealing process is commenced coincident with or during step 512 and is terminated prior to the termination of step 512.

In a specific embodiment, the annealing process is performed at a predetermined temperature in the range of 200° C. to 400° C. Moreover, in some embodiments, the annealing process is performed for a predetermined time, which is related to the predetermined temperature. Typically, annealing at lower temperatures is performed for longer times than processes performed at higher temperatures. For example, one process is performed at 200° C. for eight hours and another process is performed at 400° C. for two hours.

Figure 6:
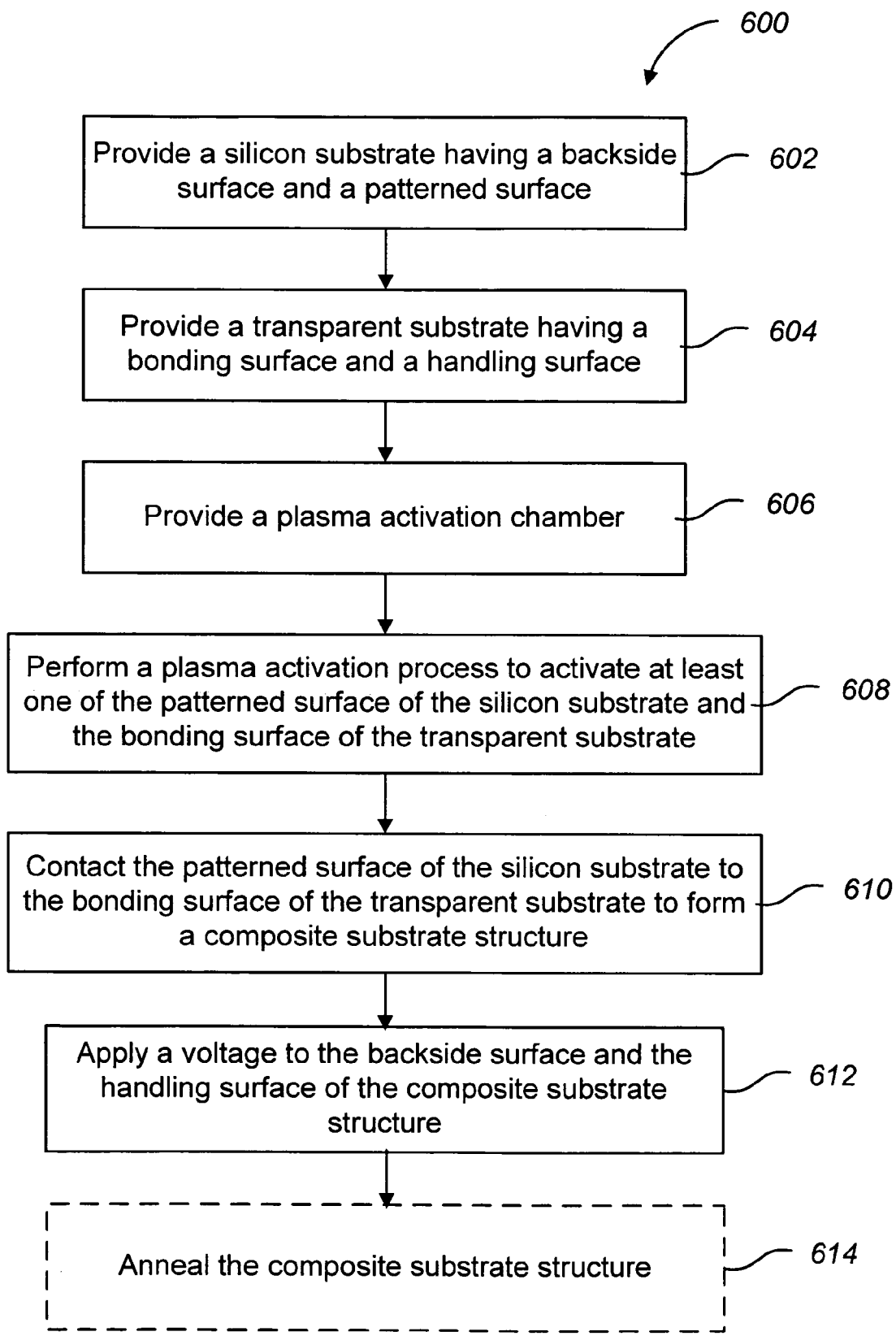
FIG. 6 is a simplified flowchart illustrating a bonding process according to yet another embodiment of the present invention.

FIG. 6 is a simplified flowchart illustrating a bonding process according to yet another embodiment of the present invention. In step 602 of process 600 for forming a composite substrate structure, a silicon substrate is provided. In the embodiment of the present invention illustrated in FIG. 6, the silicon substrate has a backside surface and a patterned surface comprising a plurality of border regions. Additional details of the patterned surface and border regions are provided with reference to FIGS. 3A-3C. In step 604, a transparent substrate is provided. In a specific embodiment a display grade glass substrate such as a Corning® EAGLE$^{2000}$™ glass panel is utilized as the transparent substrate. Moreover, in some embodiments, the transparent substrate is a low sodium content glass panel suitable for use in display applications, although this is not required by the present invention.

In step 606, a plasma activation chamber is provided. The plasma activation chamber is used in step 608 to perform a plasma activation process to activate at least one of the patterned surface of the silicon substrate and the bonding surface of the transparent substrate using a plasma activation process performed in the plasma activation chamber. In some embodiments, both of these surfaces are activated during the plasma activation process.

In step 610, the patterned surface of the silicon substrate and the bonding surface of the transparent substrate are brought into contact to form a composite substrate structure. As described above, the substrates may be brought into contact in situ, prior to removal of the two substrates from the plasma activation chamber. In alternative embodiments, contact between the two surfaces is made after the removal of the two substrates from the plasma activation chamber. A voltage is applied to the backside surface and the handling surface of the composite substrate structure in step 612. As described above, the application of the voltage in step 612 is performed in some embodiments utilizing pre-selected voltages and times. Moreover, the functional relationship of the applied voltage as a function of time varies from one embodiment to the next. Optional annealing step 614 is performed in some embodiments. As discusses previously, in various embodiments according to the present invention, steps 612 and 614 are performed sequentially, simultaneously, or in an overlapping manner.

In embodiments utilizing low sodium content display grade glass substrates as the transparent substrate, the substrate may possess local flatness on the order of less than 5 Å, but also possess larger scale waviness in excess of 5 Å. Additionally, scratches present on the surface of the substrate can exceed 5 Å in depth, reducing the local surface flatness. These surface defects may result in voids at the interface between the transparent substrate and the silicon substrate, reducing the effectiveness of covalent bonding techniques. Moreover, the low sodium content of some transparent substrates and the low concentration of mobile ions characteristic of these substrates present difficulties in performing anodic bonding of the transparent substrate to a silicon substrate. Embodiments of the present invention provide composite substrate structures and methods of forming such structures that overcome one or more of these difficulties. For example, plasma activation of one or more of the substrate surfaces provides mobile carriers at the bond interface, overcoming one of the difficulties inherent in the use of low sodium content glass substrates. Moreover, application of a voltage to the composite substrate structure enhances migration of charge carriers, increasing the bond integrity of the bond formed at the interface of the composite substrate structure.

Although the steps illustrated in FIGS. 4 to 6 follow a numerical sequence within each flowchart, it is not necessary that all of the steps be performed in sequential order. Referring to FIG. 5, the step of annealing the composite structure (514) is performed prior to, simultaneously with, or subsequent to the step of applying a voltage (512) in various embodiments. Moreover, steps 512 and 514 overlap in various combinations in other embodiments. Furthermore, additional steps may be added to the flowcharts illustrated in FIGS. 4 to 6 without departing from the scope of the present invention.

Once the bonding process illustrated in FIGS. 4 and 5 is completed, subsequent processing of the first substrate, for example a silicon substrate, may be performed as illustrated in FIG. 3C. For example, selected regions 370 of the silicon substrate are exposed to an etchant and removed while maintaining each of the silicon standoffs 124 in one embodiment of the present invention. Utilizing the bonding process provided by embodiments of the present invention, the bond formed at locations 205 will be a hermetically sealed bond suitable for a variety of device packaging processes.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a composite substrate structure, the method comprising:
    providing a first substrate comprising a silicon-containing material, the first substrate having a surface region and a backside region;
    providing a handling substrate comprising a glass material that has a sodium concentration less than about 1% by weight, the handling substrate having a bonding surface and a handling surface;
    activating at least one of the surface region of the first substrate and the bonding surface of the handling substrate using a plasma surface activation process;
    thereafter contacting the surface region of the first substrate to the bonding surface of the handling substrate to form a composite substrate structure; and
    thereafter applying a voltage to the backside region and the handling surface of the composite substrate structure.

2. The method of claim 1 wherein the step of activating comprises a surface treatment resulting in a hydrophilic surface.

3. The method of claim 2 wherein the hydrophilic surface comprises hydroxyl groups.

4. The method of claim 1 wherein the step of activating at least one of the surface region of the first substrate and the bonding surface of the handling substrate is performed in a plasma activation chamber.

5. The method of claim 4 wherein the step of contacting the surface region of the first substrate to the bonding surface of the handling substrate is performed in situ in the plasma activation chamber.

6. The method of claim 1 wherein the first substrate is a silicon substrate.

7. The method of claim 6 wherein the handling substrate is a display grade glass substrate.

8. The method of claim 7 wherein the display grade glass substrate is characterized by an RMS surface roughness value less than 5 Å.

9. The method of claim 1 further comprising after the contacting step, annealing the composite substrate structure.

10. The method of claim 9 wherein the annealing step is performed at a temperature of less than about 400° C.

11. The method of claim 1 wherein both the surface region of the first substrate and the bonding surface of the handling substrate are activated using the surface activation process.

12. The method of claim 1, wherein contacting the surface region to the bonding surface forms a covalent bond between the first substrate and the handling substrate.

13. A method for forming a composite substrate structure, the method comprising:
providing a silicon substrate, the silicon substrate having a backside surface and a patterned surface comprising a plurality of border regions;
providing a transparent substrate comprising a glass material that has a sodium concentration less than about 1% by weight, the transparent substrate having a bonding surface and a handling surface;
providing a plasma activation chamber;
activating at least one of the patterned surface of the silicon substrate and the bonding surface of the transparent substrate using a plasma activation process performed in the plasma activation chamber;
thereafter contacting the patterned surface of the silicon substrate and the bonding surface of the transparent substrate to form a composite substrate structure; and
thereafter applying a voltage to the backside surface and the handling surface of the composite substrate structure.

14. The method of claim 13 wherein the plasma activation process comprises the formation of a hydrophilic surface.

15. The method of claim 14 wherein the step of activating at least one of the patterned surface and the bonding surface is performed in situ in a plasma activation chamber.

16. The method of claim 13 further comprising, after the contacting step, annealing the composite substrate structure.

17. The method of claim 16 wherein the annealing step is performed at a temperature of less than about 400° C.

18. The method of claim 13 wherein the transparent substrate is a display grade glass substrate.

19. The method of claim 18 wherein the display grade glass substrate is characterized by an RMS surface roughness value less than 5 Å.

20. The method of claim 13, wherein contacting the patterned surface and the bonding surface forms a covalent bond between the silicon substrate and the transparent substrate.

* * * * *